United States Patent
Dimaano, Jr. et al.

(10) Patent No.: US 10,658,277 B2
(45) Date of Patent: May 19, 2020

(54) SEMICONDUCTOR PACKAGE WITH A HEAT SPREADER AND METHOD OF MANUFACTURING THEREOF

(71) Applicant: UTAC Headquarters Pte. Ltd., Singapore (SG)

(72) Inventors: Antonio Bambalan Dimaano, Jr., Singapore (SG); Nataporn Charusabha, Bangkok (TH); Saravuth Sirinorakul, Bangkok (TH); Preecha Joymak, Bangkok (TH); Roel Adeva Robles, Singapore (SG)

(73) Assignee: UTAC Headquarters Pte. Ltd., Singapore (SG)

( * ) Notice: Subject to any disclaimer, the term of this patent is extended or adjusted under 35 U.S.C. 154(b) by 0 days.

(21) Appl. No.: 16/057,792

(22) Filed: Aug. 7, 2018

(65) Prior Publication Data

US 2019/0051585 A1    Feb. 14, 2019

Related U.S. Application Data

(60) Provisional application No. 62/542,308, filed on Aug. 8, 2017.

(51) Int. Cl.
*H01L 23/495* (2006.01)
*H01L 23/31* (2006.01)
(Continued)

(52) U.S. Cl.
CPC .... *H01L 23/49568* (2013.01); *H01L 21/4825* (2013.01); *H01L 21/4875* (2013.01); *H01L 23/3121* (2013.01); *H01L 23/4334* (2013.01); *H01L 23/49524* (2013.01); *H01L 23/49548* (2013.01); *H01L 24/40* (2013.01); *H01L 23/3107* (2013.01); *H01L 23/49513* (2013.01); *H01L 24/03* (2013.01); *H01L 24/05* (2013.01); *H01L 24/06* (2013.01); *H01L 24/29* (2013.01); *H01L 24/32* (2013.01); *H01L 24/45* (2013.01); *H01L 24/48* (2013.01); *H01L 24/73* (2013.01);
(Continued)

(58) Field of Classification Search
None
See application file for complete search history.

(56) References Cited

U.S. PATENT DOCUMENTS

2006/0027900 A1\*    2/2006    Takeuchi ............ H01L 23/4334
                                                              257/675

FOREIGN PATENT DOCUMENTS

KR            101682067 B1       12/2016

\* cited by examiner

*Primary Examiner* — Hung K Vu
(74) *Attorney, Agent, or Firm* — Horizon IP PTE Ltd

(57) ABSTRACT

Embodiments of the present invention are directed to a semiconductor package with improved thermal performance. The semiconductor package includes a package substrate comprising a top substrate surface and a bottom substrate surface. The package substrate comprises a thickness extending from the top substrate surface to the bottom substrate surface. A heat spreader is disposed on the top substrate surface. The heat spreader comprises a thickness extending from a top planar surface to a bottom planar surface of the heat spreader. The top planar surface of the heat spreader is defined with a die region and a non-die region surrounding the die region. A semiconductor die is directly disposed on the top planar surface of the heat spreader in the die region. The thickness of the heat spreader is greater relative to the thickness of the package substrate.

19 Claims, 15 Drawing Sheets

(51) Int. Cl.
  *H01L 23/00* (2006.01)
  *H01L 21/48* (2006.01)
  *H01L 23/433* (2006.01)
(52) U.S. Cl.
  CPC ...... *H01L 24/92* (2013.01); *H01L 2224/0345* (2013.01); *H01L 2224/04026* (2013.01); *H01L 2224/04042* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/06181* (2013.01); *H01L 2224/2919* (2013.01); *H01L 2224/2929* (2013.01); *H01L 2224/29339* (2013.01); *H01L 2224/32245* (2013.01); *H01L 2224/40245* (2013.01); *H01L 2224/40247* (2013.01); *H01L 2224/45124* (2013.01); *H01L 2224/45139* (2013.01); *H01L 2224/45144* (2013.01); *H01L 2224/45147* (2013.01); *H01L 2224/48247* (2013.01); *H01L 2224/48257* (2013.01); *H01L 2224/48465* (2013.01); *H01L 2224/73221* (2013.01); *H01L 2224/73263* (2013.01); *H01L 2224/73265* (2013.01); *H01L 2224/92246* (2013.01); *H01L 2224/92247* (2013.01); *H01L 2224/94* (2013.01); *H01L 2224/97* (2013.01); *H01L 2924/13091* (2013.01)

SEMICONDUCTOR PACKAGE WITH A HEAT SPREADER AND METHOD OF MANUFACTURING THEREOF

CROSS-REFERENCE TO RELATED APPLICATION

This application claims the benefit of U.S. Provisional Application Ser. No. 62/542,308, filed on Aug. 8, 2017, which is herein incorporated by reference in its entirety for all purposes.

FIELD OF THE INVENTION

The present invention generally relates to a semiconductor package. More specifically, the present invention is directed to a semiconductor package having improved heat dissipation performance.

BACKGROUND

The recent rapid dissemination of smartphones and other mobile and wearable electronic terminals reflect the demand for faster, thinner and smaller products which are more compact and power-efficient. To meet these requirements, the size of various components in semiconductor packages such as fiber optic receivers, transmitters, transceivers, and transponders continue to shrink. As a result, the small area and close proximity of integrated circuits (ICs) in these modules demands small semiconductor packages with excellent thermal properties to dissipate heat generated by the semiconductor chip inside the package. With high frequency devices, small size is not only convenient but it is also a necessity of the design.

Conventional methods for transferring heat away from the semiconductor chip in semiconductor packages typically rely on providing a thermally conductive package substrate (e.g., metal lead frame, ceramic substrate) as a primary heat sink element. However, the die attach layer used for mounting a semiconductor chip to a thermally conductive package substrate are conventionally formed from heat insulating adhesive materials (e.g., polyimide tape) which impedes the thermal conductance between the semiconductor chip and package substrate. In addition, conventional solutions for improving heat dissipation properties of lead frame-based semiconductor packages include increasing a thickness of the lead frame up to about 20 mils. However, increasing a thickness of the lead frame leads to several disadvantages. For example, a thicker lead frame undesirably increases the pitch between lead fingers and increases the wear rate of a saw blade used for singulating the lead frame to form individual semiconductor packages. In another example, employing thicker lead frames invariably increases the difficulty in bending lead fingers into desired configurations.

From the foregoing discussion, there is a desire to provide a semiconductor package having improved heat dissipation performance without increasing package substrate thickness. It is also desirable to provide a cost-efficient method of producing such a semiconductor package.

SUMMARY

Embodiments of the present invention are directed to a semiconductor package with improved thermal performance. In one embodiment, a semiconductor package is disclosed. The semiconductor package includes a package substrate comprising a top substrate surface and a bottom substrate surface. The package substrate comprises a thickness extending from the top substrate surface to the bottom substrate surface. A heat spreader is disposed on the top substrate surface. The heat spreader comprises a thickness extending from a top planar surface to a bottom planar surface of the heat spreader. The top planar surface of the heat spreader is defined with a die region and a non-die region surrounding the die region. A semiconductor die is directly disposed on the top planar surface of the heat spreader in the die region. The thickness of the heat spreader is greater relative to the thickness of the package substrate.

In another embodiment, the semiconductor package comprises a lead frame. The lead frame comprises a die-attach paddle and a plurality of lead fingers peripherally located relative to the die-attach paddle. The die-attach paddle comprises a thickness extending from a top planar surface to a bottom planar surface of the die-attach paddle. A heat spreader is disposed on the top planar surface of the die-attach paddle. The heat spreader comprises a top planar surface and a bottom planar surface. The top planar surface of the heat spreader is defined with a die region and a non-die region surrounding the die region. The heat spreader comprises a thickness extending from the top planar surface the bottom planar surface of the heat spreader. A semiconductor die is directly disposed on the top planar surface of the heat spreader in the die region. The thickness of the heat spreader is greater relative to the thickness of the die-attach paddle.

In yet another embodiment, a method of forming a semiconductor package is disclosed. The method includes providing a lead frame comprising a die-attach paddle and a plurality of lead fingers peripherally located relative to the die-attach paddle. The die-attach paddle comprises a thickness extending from a top planar surface to a bottom planar surface of the die-attach paddle. A heat spreader is formed and attach to the top planar surface of the die-attach paddle. The heat spreader comprising a top planar surface and a bottom planar surface. The top planar surface of the heat spreader is defined with a die region and a non-die region surrounding the die region. The heat spreader comprises a thickness extending from the top planar surface the bottom planar surface of the heat spreader. A semiconductor die is formed and mounted to the top planar surface of the heat spreader in the die region. The heat spreader is sandwiched between the semiconductor die and the die-attach paddle. The thickness of the heat spreader is greater relative to the thickness of the die-attach paddle.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments relate to semiconductor packages and methods for forming the semiconductor packages. The semiconductor package is used to package one or more semiconductor dies or chips having an integrated circuit (IC). For the case of more than one semiconductor die, the semiconductor dies may be arranged in a planar arrangement, vertical arrangement, or a combination thereof. The semiconductor dies, for example, may include memory devices, logic devices such as mixed signal logic devices, communication devices, radio frequency (RF) devices, optoelectronic devices, digital signal processors (DSPs), microcontrollers, system-on-chips (SOCs) as well as other types of devices or a combination thereof. Such packages may be incorporated into electronic products or equipment, such as phones, computers as well as mobile and mobile smart products. Incorporating the packages into other types of products may also be useful.

Figure 1A:
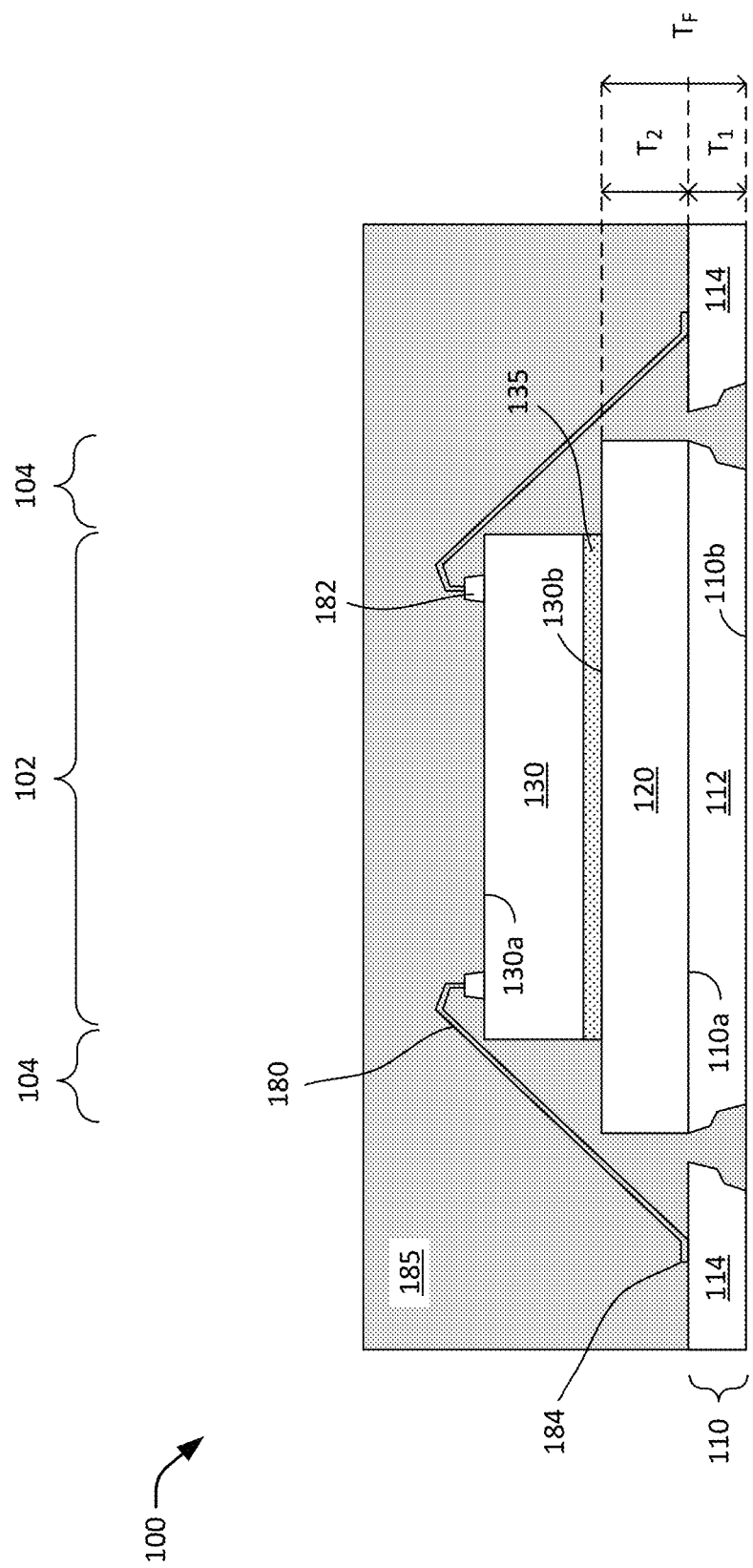
FIG. 1a shows a cross-sectional view of an embodiment of a semiconductor package.
Figure 1B:
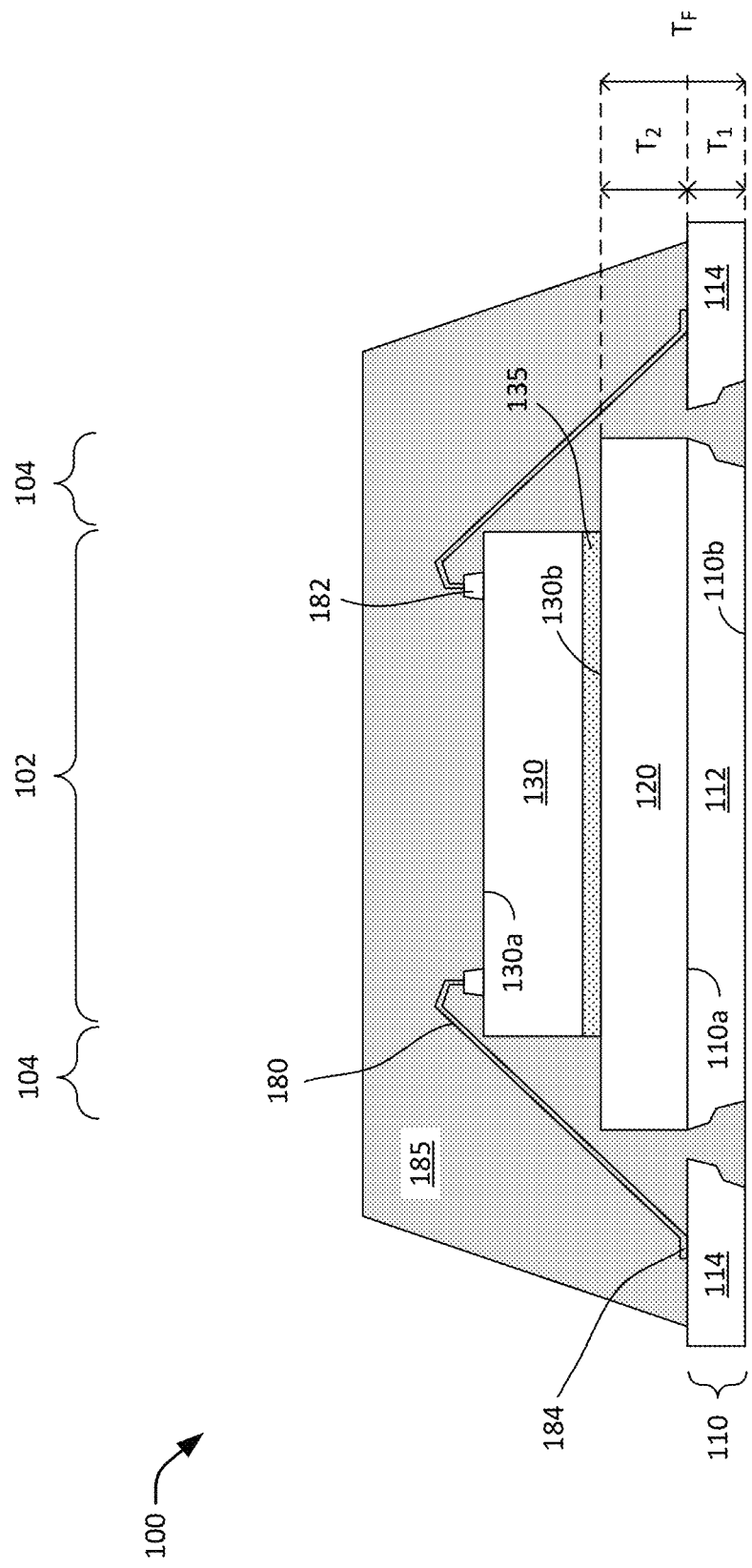
FIG. 1b shows a cross-sectional view of another embodiment of a semiconductor package.

FIGS. 1a-1b show simplified cross-sectional views of various embodiments of a semiconductor package 100 in accordance with the present invention. In particular, FIG. 1a shows an embodiment of the semiconductor package 100 and FIG. 1b shows another embodiment of the semiconductor package 100. The semiconductor package 100 includes a package substrate 110 having a first major surface 110a and a second major surface 110b opposite to the first major surface. The first major surface 110a may be referred to as the top substrate surface and the second major surface 110b may be referred to as the bottom substrate surface. Other designations for the surfaces may also be useful.

In one embodiment, the package substrate 110 is an electrically conductive chip carrier suitable for forming a lead frame based leadless package such as, but not limited to, a quad flat no-lead (QFN) package. The package substrate 110 is, for example, a lead frame configured with a centrally located die-attach paddle (DAP) 112 and a plurality of lead fingers 114 peripherally located relative to the die-attach paddle 112. The lead frame 110 may be formed from copper (Cu) material or an alloy thereof. Other suitable metal materials, such as aluminum (Al), nickel (Ni), silver (Ag), gold (Au), solder material, or the alloys of these materials, or a combination thereof may also be used to form the lead frame 110. In one embodiment, the lead frame 110 includes a thickness $T_1$ extending from the top substrate surface 110a to the bottom surface 110b. The thickness $T_1$ of the lead frame is, for example, substantially equal to 8 mils. Providing a lead frame 110 having other thickness dimensions may also be useful, depending on design requirements.

In one embodiment, a heat spreader 120 is disposed on the top substrate surface 110a of the die-attach paddle 112. The heat spreader 120, for example, covers substantially the entire top surface of the die-attach paddle 112. Other configurations of the heat spreader 120 may also be employed. For example, configuring the heat spreader 120 to partially cover the top surface of the die-attach paddle 112 may also be useful. The heat spreader 120 is a thermally conductive metal layer. In one embodiment, the heat spreader 120 includes substantially same or similar material as the lead frame 110. For example, the heat spreader 120 may be formed from copper, or an alloy thereof, for a copper lead frame 110. Other thermally conductive metal materials, such as aluminum (Al), nickel (Ni), silver (Ag), gold (Au), solder material, or an alloy thereof may also be used to form the heat spreader 120. For example, the heat spreader 120 may be formed from a different material as the lead frame 110. In one embodiment, the heat spreader 120 includes a thickness $T_2$ that is greater relative to the thickness $T_1$ of the lead frame 110. The thickness $T_2$ of the heat spreader 120 is, for example, substantially equal to 12 mils. Providing a heat spreader 120 configured with other thickness dimensions may also be useful, depending on design requirements.

In one embodiment, the heat spreader 120 is defined with die region 102 and a non-die region 104 surrounding the die region 102. The die region 102 is, for example, concentrically positioned within the periphery of the heat spreader 120. Other configurations of the die and non-die regions may also be useful. As shown, a semiconductor die or chip 130 is attached to the top surface of the heat spreader 120 in the die region 102. The semiconductor die 130 includes a first major surface 130a and a second major surface 130b opposite to the first major surface. The first major surface 130a may be referred to as the top surface and the second major surface 130b may be referred to as the bottom surface. Other designations for the surfaces may also be useful.

In one embodiment, the bottom surface 130b of the semiconductor die 130 is defined by an electrically and thermally conductive contact layer 135. The contact layer 135 is, for example, a backside metal layer plated to the bottom surface 130b of the semiconductor die 130. In one embodiment, the backside metal layer 135 includes substantially same or similar material as the heat spreader 120. For example, the backside metal layer 135 may be formed from copper, or an alloy thereof, for a copper heat spreader 120. Other suitable metal materials, such as aluminum (Al), nickel (Ni), silver (Ag), gold (Au), solder material, or an alloy thereof may also be used to form the backside metal layer 135. For example, the backside metal layer 135 may be formed from a different metal material as the heat spreader 120.

In one embodiment, the backside metal layer 135 of the semiconductor die 130 is mounted onto the top surface of the heat spreader 120 in the die region 102 using a die-attach layer (not shown). The die-attach layer is, for example, an electrically and/or thermally conductive adhesive layer. Various suitable adhesive materials may be used to form the die-attach layer. For example, the die-attach layer may be silver paste, epoxy resin paste, polyimide tape, or the like. Preferably, the die-attach layer is an electrically and thermally conductive adhesive layer, such as silver paste. Other types of adhesive material, including solder material, may also be used to form the die-attach layer. The die-attach layer directly attaches a bottom of the semiconductor die 130 (e.g., backside metal layer 135) to the heat spreader 120.

The top surface 130a of the semiconductor die 130 includes openings (not shown) in a final passivation layer to expose conductive die pads (not shown). The surfaces of the die pads, for example, are substantially coplanar with the first major surface of the semiconductor die 130. Providing die pads with surfaces which are not coplanar with the first major surface of the semiconductor die may also be useful. The die pads serve as contact terminals for electrically connections to the internal circuitry of the semiconductor die 130. The die pads, for example, are formed of an electrically conductive material, such as Cu, Al, Au, Ag, Ni, solder material, or the alloys of these materials, or a combination thereof. Other types of conductive material may also be used for the die pads. The pattern of the die pads may be one or more rows disposed along the peripheral region of the top surface 130a. Other die pad patterns may also be useful.

Wire bonds 180 are provided to couple the die pads on the top surface 130a of the semiconductor die 130 to an inner region (e.g., region proximate to the die-attached paddle 112) of the lead fingers. The wire bonds 180, for example, may be formed of any suitable metal material such as, but not limited to, Cu, Au, Ag, Al, or the alloys of these materials, or a combination thereof. Other types of conductive material may also be used. In one embodiment, a first end of each wire bond 180 is coupled to a die pad using a first type bond 182, and a second end of each wire bond 180 is coupled to an associated lead finger 114 using a second type bond 184. The first and second type bonds 182 and 184 may be different types. For example, the first end of each wire bond 180 is bonded to the die pad using a ball bond 182 while the second end of the wire bond 180 is bonded to the top surface of the respective lead finger 114 using a stitch or wedge bond 184. Other suitable types of wire bonding configurations may also be useful. Providing the first and second ends of the wire bonds 180 with same type bonds may also be useful. The wire bonds 182 and 184 create an electrical connection between the die pads on the semiconductor die 130 and the lead fingers 114 of the lead frame 110.

The semiconductor die 130 may be in electrical communication with the die-attach paddle 112. In one embodiment, the semiconductor die 130 is electrically connected to the die-attach paddle 112 by means of the backside metal layer 135, the electrically conductive die-attach layer (e.g., silver paste), and the heat spreader 120. The backside metal layer 135, for example, provides an electrical connection to a source/drain (S/D) region of the semiconductor die 130. Other methods for electrically connecting the semiconductor die 130 to the die-attach paddle 112 may also be employed.

The semiconductor package 100 includes an encapsulant structure 185 having top and bottom planar surfaces. In one embodiment, the encapsulant structure 185 is configured with substantially vertical sidewalls, as shown in FIG. 1a. The substantially vertical sidewalls of the encapsulant structure are, for example, formed by a saw singulation process. In an alternative embodiment, the encapsulant structure 185 may be configured with sloped (or slanted) sidewalls, as shown particularly in FIG. 1b. For example, the sidewalls of the encapsulant structure 130 slopes downwardly from the top planar surface to the bottom planar surface. The sloped sidewalls of the encapsulant structure are, for example, formed by a punch singulation process. Other configurations of encapsulant structure 185 may also be useful.

In one embodiment, the encapsulant structure 185 encapsulates the semiconductor die 130, the heat spreader 120 and the wire bonds 180. For example, the top planar surface of the encapsulant structure 185 extends above the wire bonds 180 and semiconductor die 130. In one embodiment, the encapsulant structure 185 covers sidewalls of the heat spreader 120 and top substrate surface of the plurality of lead fingers 114 while exposing an outer sidewall and a bottom planar surface of the lead fingers 114. For example, the bottom planar surface of the encapsulant structure 185 is substantially coplanar with the bottom substrate surface 110b, including the bottom planar surface of the die-attach paddle 112 and lead fingers 114. Other configurations of the encapsulant structure 185 may also be useful. The encapsulant structure 185 may be formed from an encapsulant material, such as molding material. For example, the encapsulant material may be any suitable polymeric material such as epoxy and polyimide resin. Other types of encapsulant material may also be useful. For example, the encapsulant structure 185 may also include silicon, plastic or ceramic material. The encapsulant structure 185 protects the semiconductor die 130 from moisture in the semiconductor package environment.

As will be appreciated by those of skill in the art, the lead fingers 114 and die-attach paddle 112 may serve as terminal leads or pins of the semiconductor package 100 for external package connections. For example, the lead fingers 114 and die-attach paddle 112 may provide the semiconductor die 130 with external electrical connections to the source terminal, the drain terminal and/or the gate terminal on an external device (not shown), such as a printed circuit board. The plurality of lead fingers 114 may serve as source leads for source terminal connections and/or gate leads for gate terminal connections, while the die-attach paddle 112 may serve as a drain lead for a drain terminal connection. For example, the exposed bottom planar surface of the die-attach paddle 112, and the exposed outer sidewalls and/or bottom planar surface of the lead fingers 114, may serve as contacts pads for electrically connecting the semiconductor die 130 to appropriate terminals on a printed circuit board. Other configurations of the terminal connections may also be useful.

In comparison to conventional semiconductor packages, the semiconductor package 100 as described in FIGS. 1a-1b provides a heat spreader 120 sandwiched between the semiconductor die 130 and the lead frame 110 to enhance thermal performance of the die-attach paddle 112. The die-attach paddle 112, in combination with the heat spreader 120, functions as a thick die pad having a final thickness TF substantially equal to 20 mils. The thick die pad corresponds to a thick heat sink element that enables the semiconductor package 100 to achieve heat dissipation performance comparable to or greater than, conventional semiconductor packages having thick lead frames and/or thick die-attach paddles (e.g., thickness of 20 mils). In addition, heat generated by the semiconductor die can be more efficiently conducted away by providing an intimate contact between the heat spreader 120 and the semiconductor die 130 while maintaining a small package footprint and a fine pitch between lead fingers.

Figure 2:
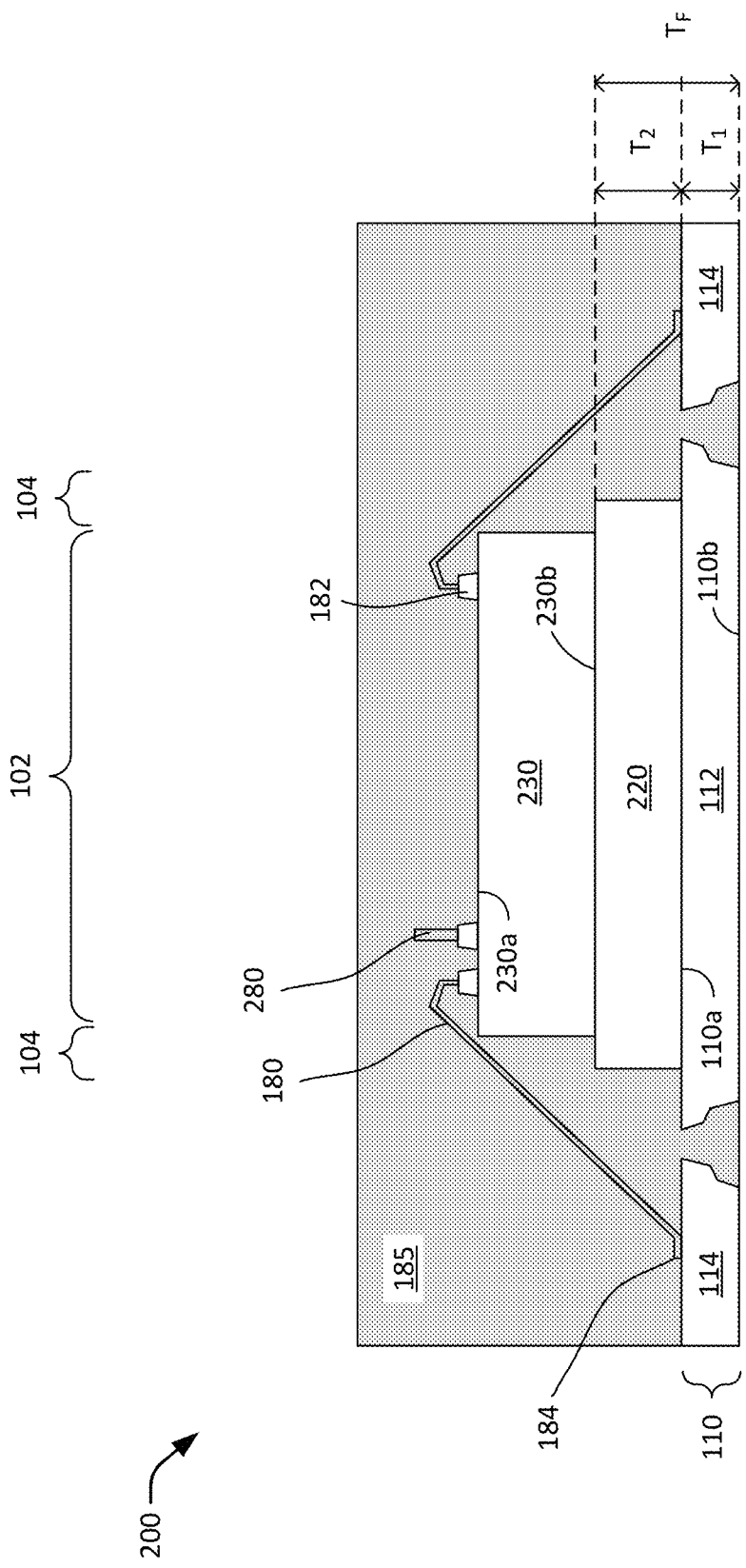
FIG. 2 shows a cross-sectional view of yet another embodiment of a semiconductor package.

FIG. 2 shows a simplified cross-sectional view of yet another embodiment of a semiconductor package 200 in accordance with the present invention. The semiconductor package 200 is similar to the semiconductor package 100 described in FIGS. 1a-1b. Common elements and features having the same reference numerals may not be described or described in detail. In the interest of brevity, the description of the semiconductor package 200 shown in FIG. 2 primarily focuses on the difference(s) compared with the semiconductor package 100 shown in FIG. 1a.

Referring now to FIG. 2, a semiconductor die 230 is attached to the top surface of the heat spreader 220 in the die region 102. The semiconductor die 230 includes a first major surface 230a and a second major surface 230b. The first major surface 230a may be referred to as the top surface and the second major surface 230b may be referred to as the bottom surface. Other designations for the surfaces may also be useful. In one embodiment, the bottom surface 230b of the semiconductor die 230 is defined by a silicon substrate material, such as silicon wafer material. For example, the semiconductor die 230 is devoid of a backside metal layer.

In one embodiment, the bottom surface 230b of the semiconductor die 230 is mounted onto the top surface of the heat spreader 220 in the die region 102 using a die-attach layer (not shown). The die-attach layer is, for example, a thermally conductive adhesive layer. Various thermally conductive adhesive material may be used to form the die attach layer. For example, the die-attach layer may be silver paste, epoxy resin paste, polyimide tape, or the like. Other types of adhesive material may also be used to form the die-attach layer.

In one embodiment, the heat spreader 220 is disposed on the top substrate surface 110a of the die-attach paddle 112. The heat spreader 220 is a thermally conductive metal layer. In one embodiment, the heat spreader 220 includes substantially same or similar material as the lead frame 110. For example, the heat spreader 220 may be formed from copper, or an alloy thereof, for a copper lead frame 110. Other thermally conductive metal materials, such as aluminum (Al), nickel (Ni), silver (Ag), gold (Au), solder material, or an alloy thereof may also be used to form the heat spreader 220. In one embodiment, the heat spreader 220 includes a thickness $T_2$ that is greater relative to the thickness $T_1$ of the lead frame 110. The thickness $T_2$ of the heat spreader 220 is, for example, substantially equal to 12 mils. Providing a heat spreader 220 configured with other thickness dimensions may also be useful, depending on design requirements.

As shown in FIG. 2, the heat spreader 220 may include sufficient length and width dimensions to substantially contact the entire bottom surface 230b of the semiconductor die 230 without covering the entire top surface of the die-attach paddle 112. For example, a peripheral region of the top surface of the die-attach paddle 112 is exposed by the heat spreader 220. In such case, the exposed peripheral region of the top surface of the die-attach paddle 112 may be covered by the encapsulant structure 185.

The semiconductor die 230 may be in electrical communication with the die-attach paddle 112. In one embodiment, the semiconductor die 230 is electrically connected to the die-attach paddle 112 by means of a wire bond 280. For example, a first end of the wire bond 280 is coupled to a die pad of the semiconductor die 230 while a second end of the wire bond 280 may be electrically and mechanically coupled to the exposed peripheral region of the top surface of the die-attach paddle 112. Alternatively, the second end of the wire bond 280 may be electrically and mechanically coupled to the non-die region 104 of the heat spreader 220. The wire bond 280 provides an electrical connection to a source/drain (S/D) region of the semiconductor die 230. Other configurations for electrically connecting the semiconductor die 230 to the die-attach paddle 112 may also be useful.

The lead fingers 114 and die-attach paddle 112 may serve as terminal leads or pins of the semiconductor package 200 for external package connections. For example, the lead fingers 114 and die-attach paddle 112 may provide the semiconductor die 230 with external electrical connections to the source terminal, the drain terminal and/or the gate terminal on an external device (not shown), such as a printed circuit board. For example, the plurality of lead fingers 114 may serve as source leads for source terminal connections and/or gate leads for gate terminal connections, while the die-attach paddle 112 may serve as a drain lead for a drain terminal connection. Other configurations of the terminal connections may also be useful.

The semiconductor package 200 described includes same or similar advantages as described with respect to the semiconductor package 100 in FIGS. 1a-1b. In the interest of brevity, these advantages will not be described or described in detail.

Figure 3:
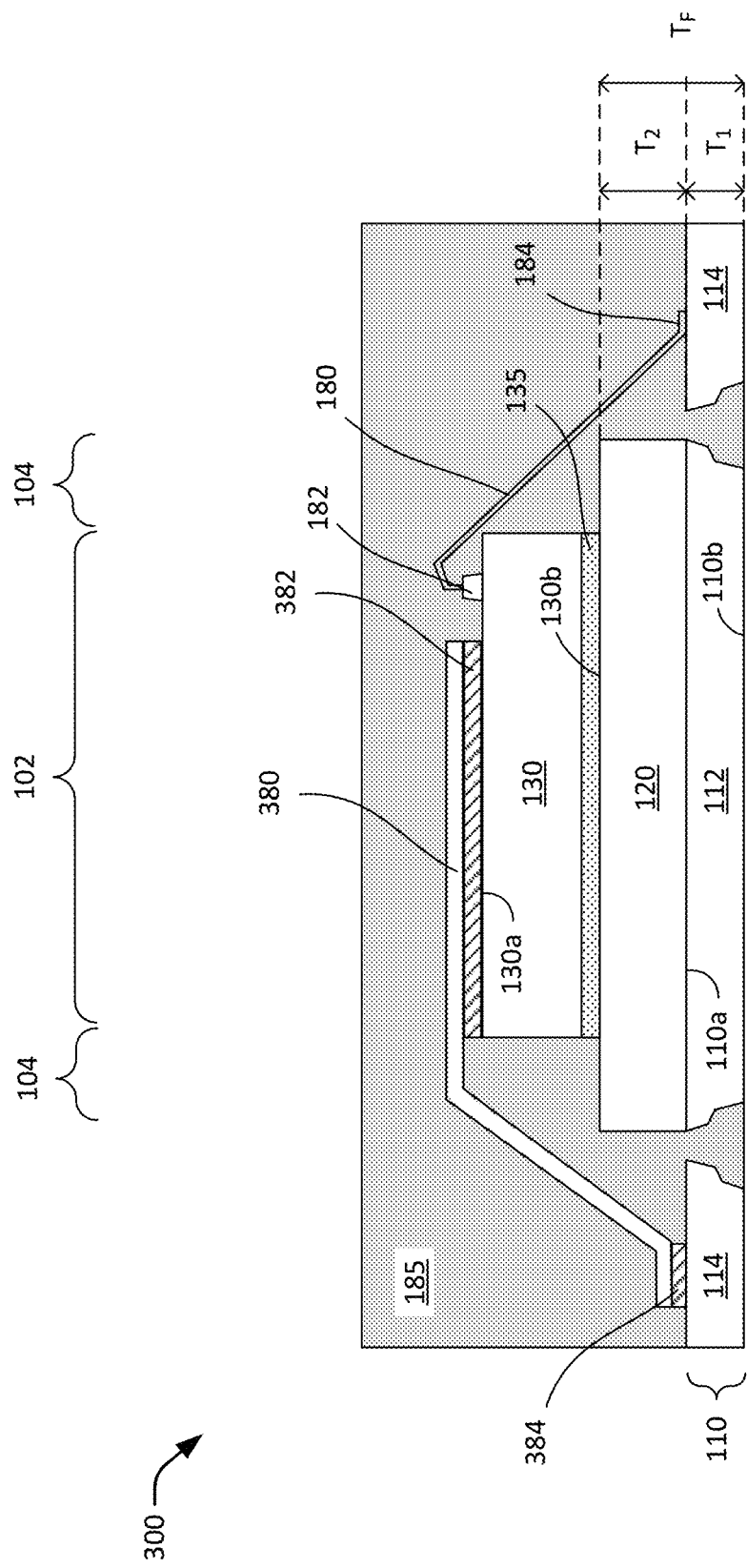
FIG. 3 shows a cross-sectional view of another embodiment of a semiconductor package.

FIG. 3 shows a simplified cross-sectional view of another embodiment of a semiconductor package 300 in accordance with the present invention. The semiconductor package 300 is similar to the semiconductor package 100 described in FIGS. 1a-1b. Common elements and features having the same reference numerals may not be described or described in detail. In the interest of brevity, the description of the semiconductor package 300 shown in FIG. 3 primarily focuses on the difference(s) compared with the semiconductor package 100 shown in FIG. 1a.

Referring now to FIG. 3, the semiconductor die 130 is disposed between a clip structure 380 and the heat spreader 120. The clip structure 380 includes electrically conductive material. The clip structure 380 is, for example, formed from copper or copper alloy material. Other electrically conductive materials may also be used to form the clip structure. In one embodiment, the top planar portion of the clip structure 380 is electrically and mechanically attached to the top surface 130a of the semiconductor die 130 using a first thermally and electrically conductive adhesive layer 382. The first adhesive layer 382 is, for example, a layer of solder material or solder paste. The first adhesive layer 382 electrically connects the clip structure 380 to a one or more die pads on the top surface 130a of the semiconductor die 130. In one embodiment, the bottom planar portion of the clip structure 380 is electrically and mechanically coupled to the top surface of associated lead fingers using a second thermally and electrically conductive adhesive layer 384. The second adhesive layer 384 may be same as the first adhesive layer 382. For example, the second adhesive layer 384 is a layer of solder material or solder paste. Other configurations of first and second adhesive layers may also be useful. In one embodiment, the clip structure 380 is provided in place of an array of wire bonds 180 that are electrically connected to a common terminal on an external device, such as a printed circuit board. For example, the clip structure 380 electrically connects one or more source regions in the semiconductor die 130 to a plurality of source leads. Alternatively, the clip structure 380 may be provided to electrically connect one or more drain regions in the semiconductor die 130 to a plurality of drain leads.

In comparison to conventional wire bond interconnections between a semiconductor die and a lead frame, replacing multiple wire bonds with the clip structure 380 advantageously reduces parasitic electrical resistance and improves thermal performance of the semiconductor package 300 by providing efficient heat dissipation from the top portion of the semiconductor die 130 to the lead frame 110.

Figure 4A:
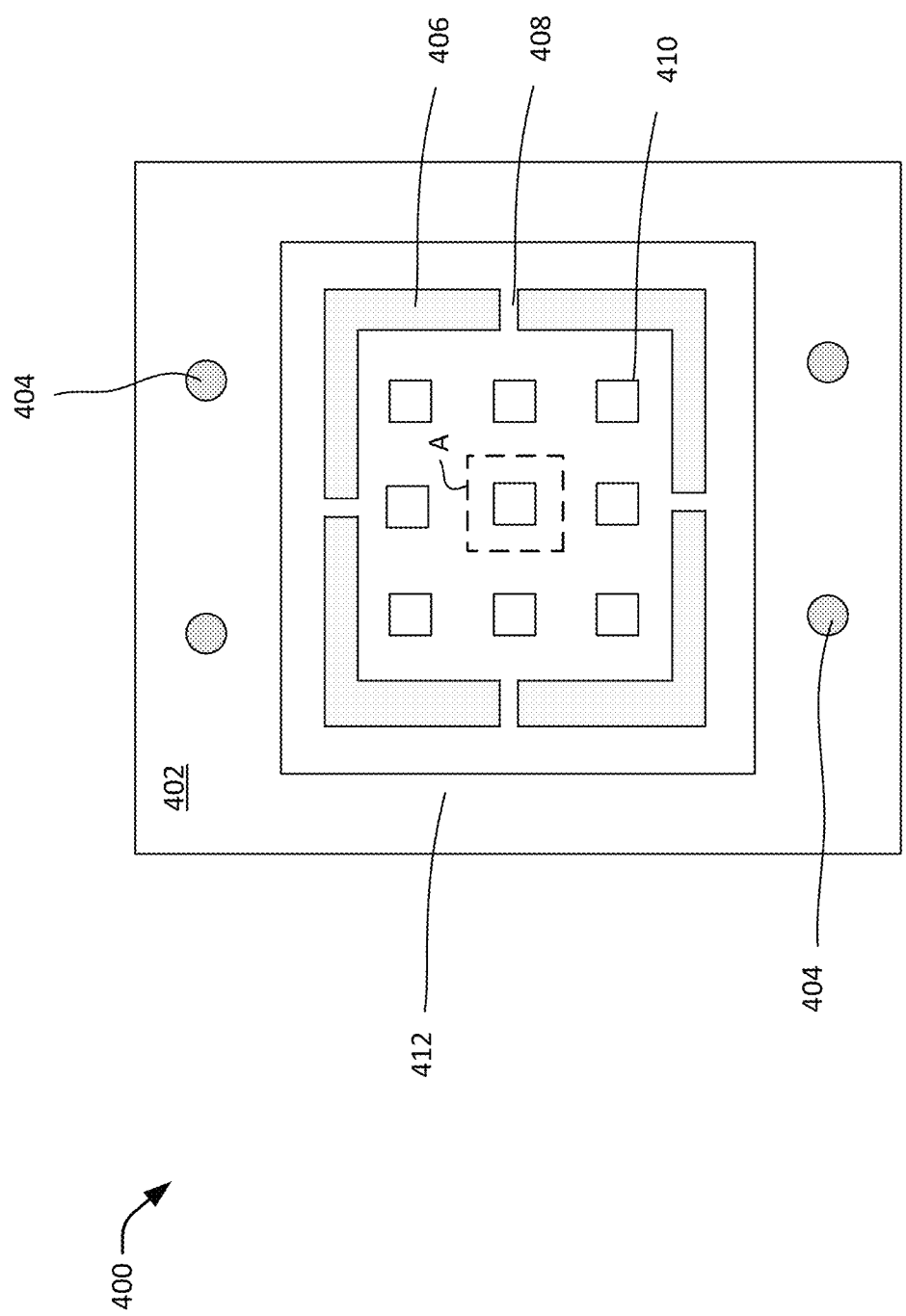
FIGS. 4a-4g show various views of an embodiment of a process for forming a semiconductor package.
Figure 4B:
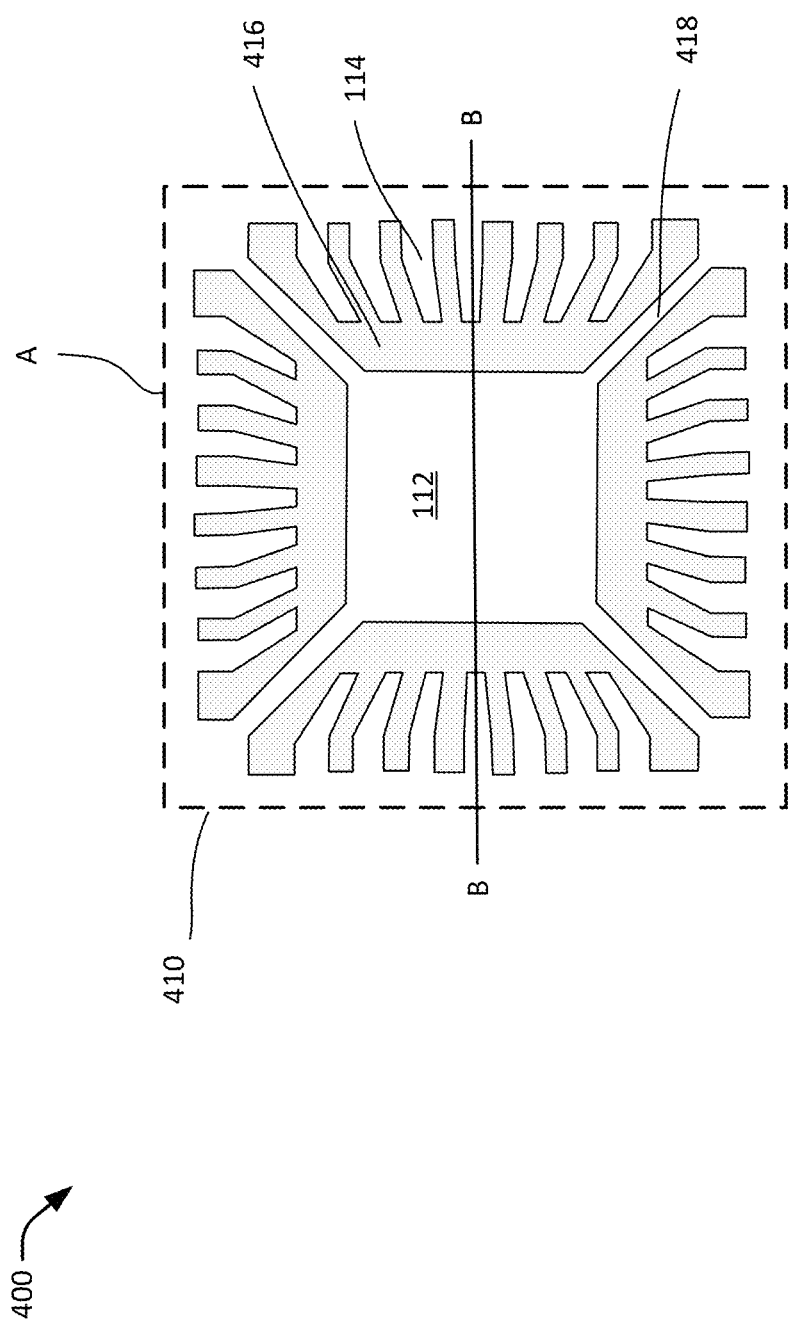

FIGS. 4a-4g show various views of an embodiment of a process 400 for forming a semiconductor package. The process 400, for example, includes providing a package substrate. In particular, FIG. 4a shows a simplified plan view of the package substrate in accordance to a step of the process 400, FIG. 4b shows an enlarged plan view of portion A of the package substrate of FIG. 4a, and FIGS. 4c-4g show cross-sectional views of the package substrate in accordance to other steps of the process 400. The process 400 may be employed to form, for example, a semiconductor package same or similar as that described in FIGS. 1a-1b and 2. In the interest of brevity, common elements and features having the same reference numerals may not be described or described in detail.

Referring to FIG. 4a, package substrate 402 is provided. The package substrate 402 may be formed from an electrically and thermally conductive material. In one embodiment, the package substrate 402 is a lead frame fabricated in a strip format to process a plurality of semiconductor packages. The package substrate 402 is, for example, a lead frame strip formed from copper (Cu) material or an alloy thereof. Other suitable metal materials, such as aluminum (Al), silver (Ag), gold (Au) or the alloys of these materials, or a combination thereof may also be used to form the package substrate 402. For example, the package substrate 402 may also be a silver-plated copper lead frame. Providing a lead frame configured in other formats may also be useful. In one embodiment, the lead frame strip 402 is patterned to form an array of lead frame units 410 integrally connected to one another in a matrix format within a lead frame panel 412. For example, the lead frame strip 402 may be patterned by mask and etch processes. Alternatively, the lead frame strip 402 may be patterned by stamping process. Other processes may also be employed to form a plurality of lead frame units 410. For convenience, only a portion of the lead frame strip 402 is illustrated in FIG. 4a.

The lead frame strip 402 may include position alignment holes 404 formed along guide rail portions of the lead frame strip 402. In one embodiment, the lead frame panel 412 includes elongated slots 406 extending discontinuously along the perimeter of the lead frame panel 412. The slots 406 are, for example, discontinued by connection bars 408 that are formed across the slots 406 to support the center region of the lead frame panel 412. It is understood that the number and position of the connection bars 408 is not limited to that illustrated in FIG. 4a.

Referring to FIG. 4b, an enlarged plan view of portion A of the lead frame panel 412 of FIG. 4a is illustrated. As shown, a lead frame unit 410 includes a die-attach paddle 112. The die-attach paddle 112 may be a metal platform formed centrally within a lead frame opening 416 and supported by support elements 418 emanating from the die-attach paddle 112 to the lead frame panel 412 (or lead frame). In one embodiment, the support elements 418 may be tie bars. For example, a tie bar 418 may be disposed at each corner of the die-attach paddle 112 to support the die-attach paddle 112. The tie bars 418 may be formed from substantially same or similar metal material as the lead frame 412. For example, the tie bars 418 are formed from copper or an alloy thereof. Other metal materials, including Al, Ni, or an alloy thereof, may also be used to form the tie bars 418.

The lead frame unit 410 includes a plurality of lead fingers 114 radially extending from the lead frame 410 towards the die-attach paddle 112 without contacting the die-attach paddle 112. The lead fingers 114 are, for example, positioned a predetermined distance away from the die-attach paddle 112.

It is understood that dam bars (not shown) may be formed within the lead frame panel 412 (or lead frame) between adjacent lead frame units 410. For example, adjacent lead frame units 410 may share a common dam bar and the dam bars may be formed in a lattice format throughout the lead frame panel 412. Other configurations of dam bars may also be provided.

Figure 4C:
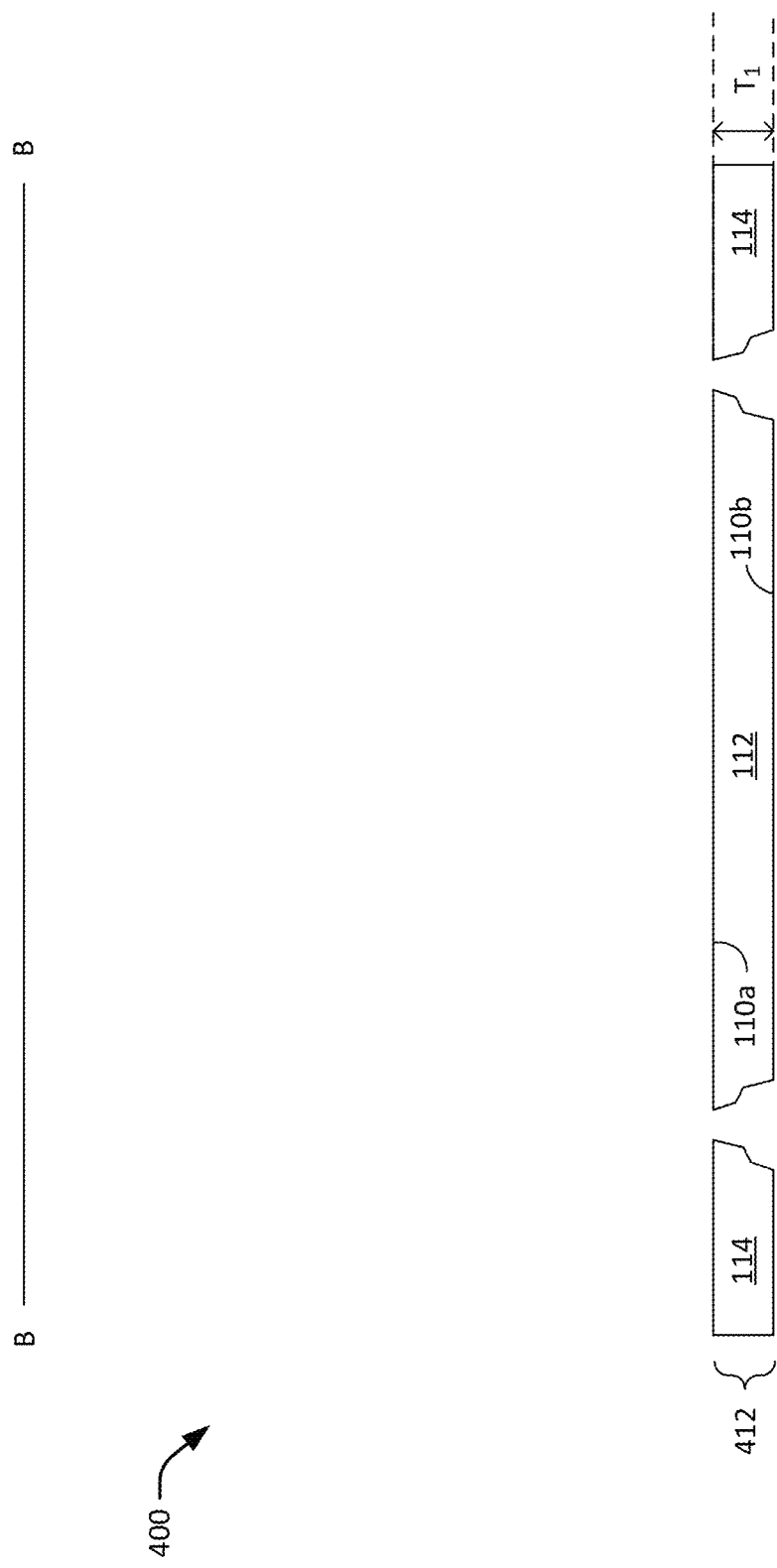

Referring to FIG. 4c, a cross-sectional view of the lead frame unit 410 of FIG. 4b, taken along line B-B, is illustrated. As shown, the lead frame 412 is configured with a thickness $T_1$ extending from a top planar substrate surface 110a to a bottom planar substrate surface 110b. The thickness of the lead frame 412 may define a thickness of the die-attach paddle 112. The thickness $T_1$ is, for example, substantially equal to 8 mils. Other thickness configurations may also be useful.

Figure 4D:
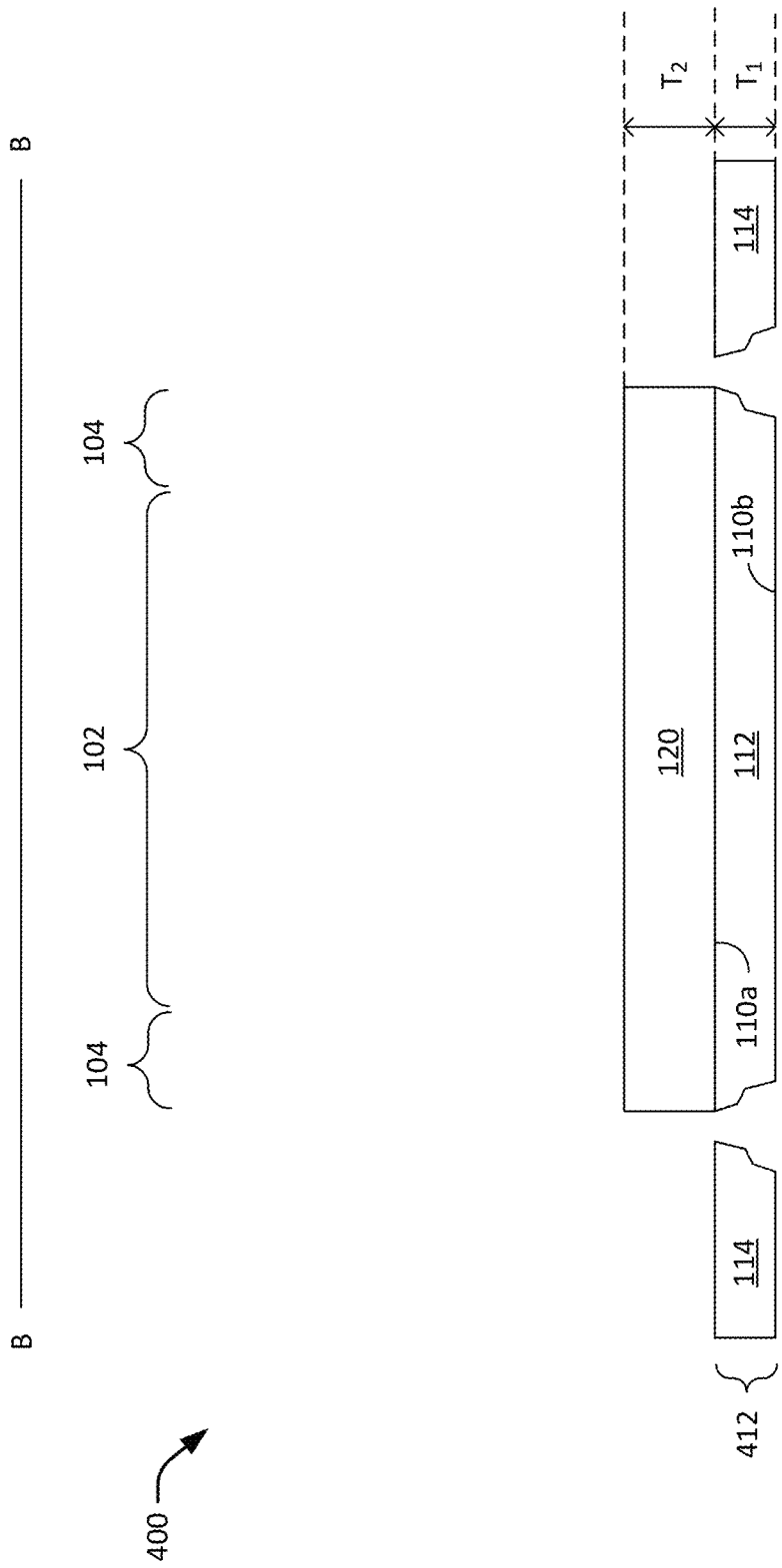

Referring to FIG. 4d, a heat spreader 120 is formed and attached to the top surface of the die-attach paddle 112. In one embodiment, the heat spreader 120 is formed with sufficient length and width dimensions to substantially cover an entire bottom surface of a subsequently provided semiconductor die. For example, the heat spreader covers an entire top surface of the die-attach paddle 112. Providing a heat spreader having other dimensions may also be useful. In one embodiment, the heat spreader 120 is configured with a thickness $T_2$ extending from a top planar surface to a bottom planar surface of the heat spreader 120. The thickness $T_2$ of the heat spreader may be greater than the thickness $T_1$ of the die-attach paddle 112. The thickness $T_2$ is, for example, substantially equal to 12 mils. Other thickness configurations may also be useful. The heat spreader 120 may include substantially same or similar material as the die-attach paddle 112. For example, the heat spreader 120 may be formed from copper, or an alloy thereof, for a copper die-attach paddle 112. Other suitable thermally conductive metal materials, such as Al, Ni, Ag, Au, solder, or an alloy thereof may also be used.

The process for attaching the bottom planar surface of the heat spreader 120 to the top surface of the die-attach paddle 112 forms an intimate contact between the heat spreader 120 and die-attach paddle 112. In one embodiment, a mechanical process is employed to form a welding connection between the heat spreader 120 and die-attach paddle 112. The mechanical process is, for example, an ultrasonic welding process. Other suitable mechanical processes, such as thermocompression and thermosonic processes, may also be employed to achieve metallurgic welding between the heat spreader 120 and die-attach paddle 112. In an alternative embodiment, a bonding process is employed to form a mechanical bond between the heat spreader 120 and die-attach paddle 112. The bonding process is, for example, a sintering process. For example, the heat spreader 120 is sintered to the die-attach paddle 112 using copper paste. Other suitable metal materials, including silver (Ag), may also be used to form a sintered bond between heat spreader 120 and die-attach paddle 112. In yet another embodiment, a bonding process is employed to form a chemical bond between the heat spreader 120 and die-attach paddle 112. The bonding process is, for example, a soldering process. For example, the heat spreader 120 is soldered to the die-attach paddle 112 using any suitable solder material or metal alloy. Other techniques for attaching the heat spreader 120 to the die-attach paddle 112 may also be useful.

Figure 4E:
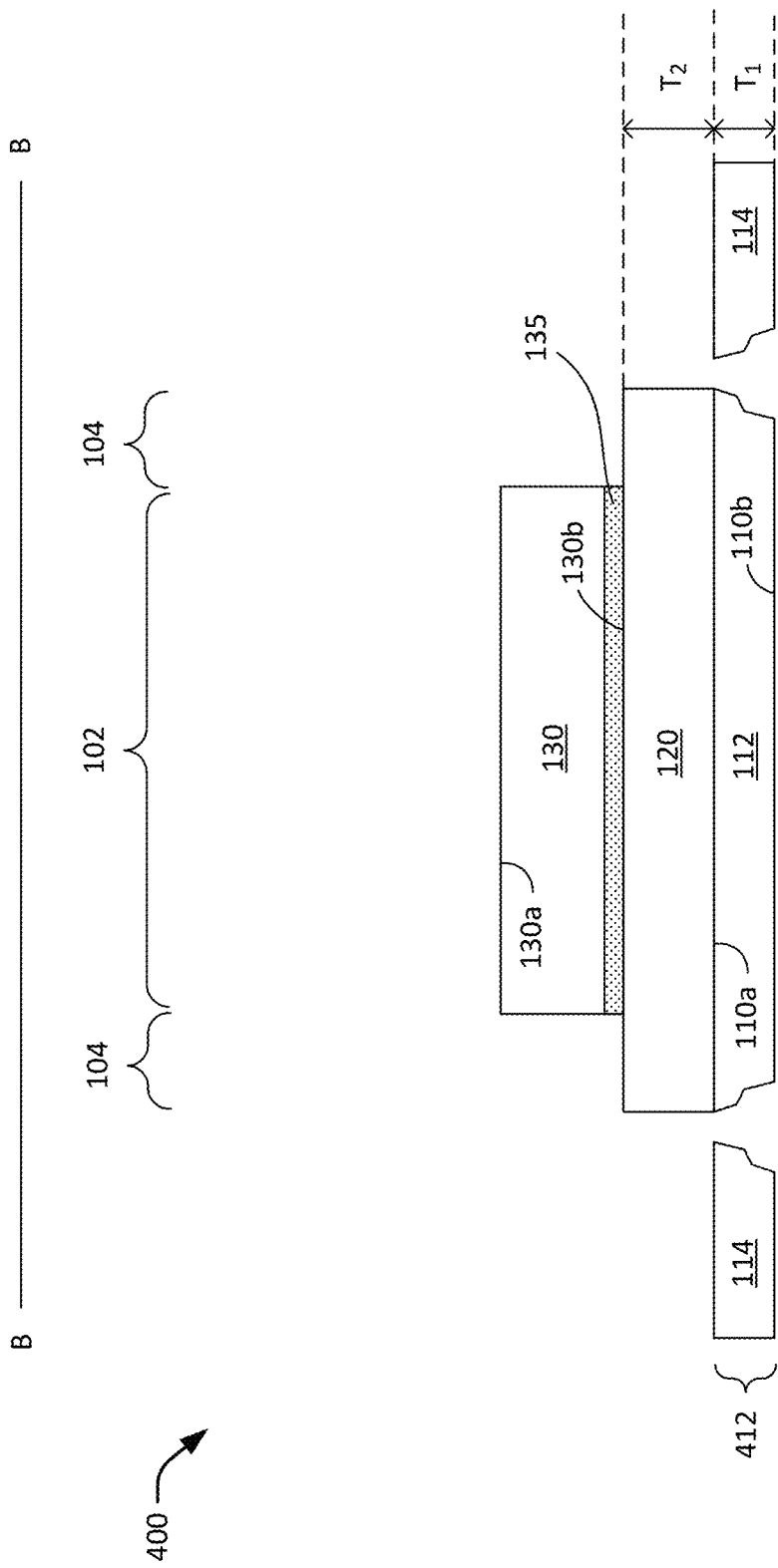

Referring to FIG. 4e, a semiconductor die 130 is formed and attached to the top surface of the heat spreader 120. The semiconductor die may include a metal-oxide-semiconductor field-effect transistor (MOSFET) such as, but not limited to, a power MOSFET. The MOSFET may be configured with any suitable orientations (or structure), including vertical and lateral orientations (not shown). For example, the semiconductor die 130 may include vertical or lateral power MOSFET. Other configurations and types of MOSFET may also be attached to the heat spreader 120. The semiconductor die 130 may be fabricated by a multi-step process. For example, a plurality of semiconductor dies are fabricated in parallel on a semiconductor substrate (not shown), e.g., silicon, wafer. A wafer singulation process, such as dicing process, may be performed to singulate (or separate) the individual semiconductor dies for mounting on a package substrate, e.g., lead frame.

A wafer that is ready for wafer dicing typically has the semiconductor die's active components on a top side of the wafer and the semiconductor substrate on a bottom side of the wafer. In one embodiment, the wafer singulation process to form the semiconductor die 130 includes a preliminary step of wafer thinning prior to dicing. For example, a backside grinding process is performed on the bottom side of the semiconductor substrate (or wafer) to achieve a desired die thickness dimension.

In one embodiment, a backside metallization process is performed on the bottom side of the wafer after thinning and before dicing. Backside metallization may be achieved by, for example, suitable deposition techniques such as vapor deposition or sputtering. Other deposition techniques may also be useful. The backside metallization process, for example, forms a backside metal layer 135 on the bottom side of the wafer. The backside metal layer 135 may include any suitable type of metal material such as, but not limited to, Cu, Al or an alloy thereof. The wafer is subsequently singulated (or diced) to form a plurality of semiconductor dies 130 having a bottom surface 130b defined by the backside metal layer 135. The backside metal layer 135 improves electrical performance of the semiconductor die.

It is understood that the wafer may also be singulated without performing a backside metallization process to provide a semiconductor die devoid of a backside metal layer. For example, a semiconductor die 230 as described with respect to FIG. 2 may also be attached to the heat spreader 120.

In one embodiment, a die attach layer (not shown) is formed to attach the semiconductor die 130 to the top surface of the heat spreader 120. The die attach layer is, for example, sandwiched between the bottom surface 130b of the semiconductor die 130 and the top surface of the heat spreader 120. The die attach layer serves as an adhesive layer to bond and fix the semiconductor die 130 on the top surface of the heat spreader 120 in the die region 102, while providing electrically and/or thermally conductive contact for the semiconductor die 130. For example, the die-attach layer may be silver paste, epoxy resin paste, polyimide tape, or the like. Preferably, the die-attach layer includes silver material. Other types of adhesive material, including solder material, may also be used to form the die-attach layer.

Figure 4F:
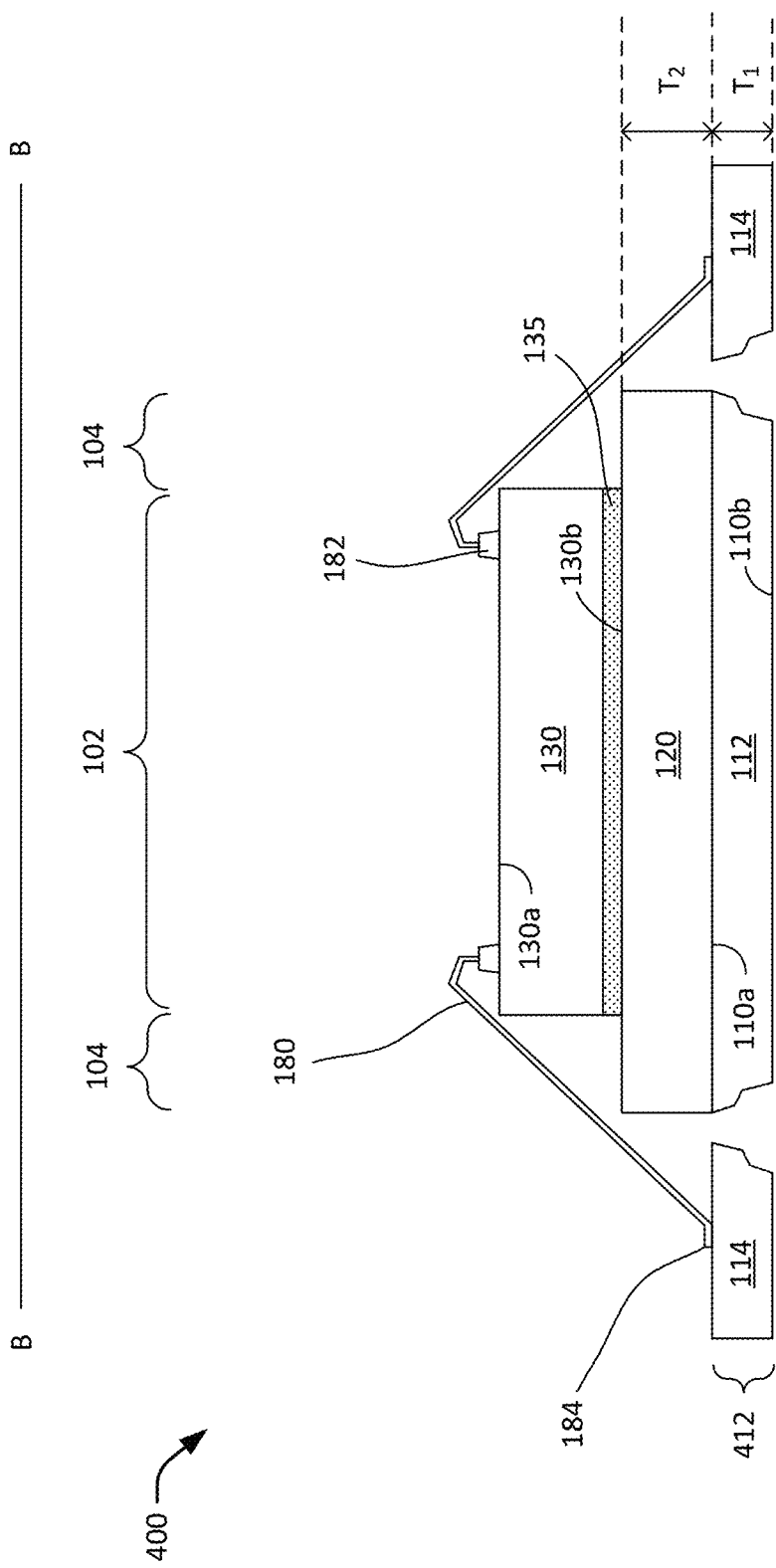

Referring to FIG. 4f, a plurality of wire bonds 180 are formed to electrically connect the semiconductor die 130 to the lead fingers 114. In one embodiment, each wire bond corresponds to a metal wire. The metal wires, for example, may be formed from Au, Cu, Ag or any alloy thereof. In one embodiment, a first end of the wire bond 180 is bonded to the die pad on the top surface 130a of the semiconductor die 130 so as to form a ball bond 182, while a second end of the wire bond 180 is bonded to an inner region (e.g., region proximate to the die-attached paddle 112) of the lead fingers 114 so as to form a stitch or wedge bond 184. Other suitable types of wire bonding configuration may also be useful. Providing the first and second of the wire bonds 180 with same type bonds may also be useful.

Figure 4G:
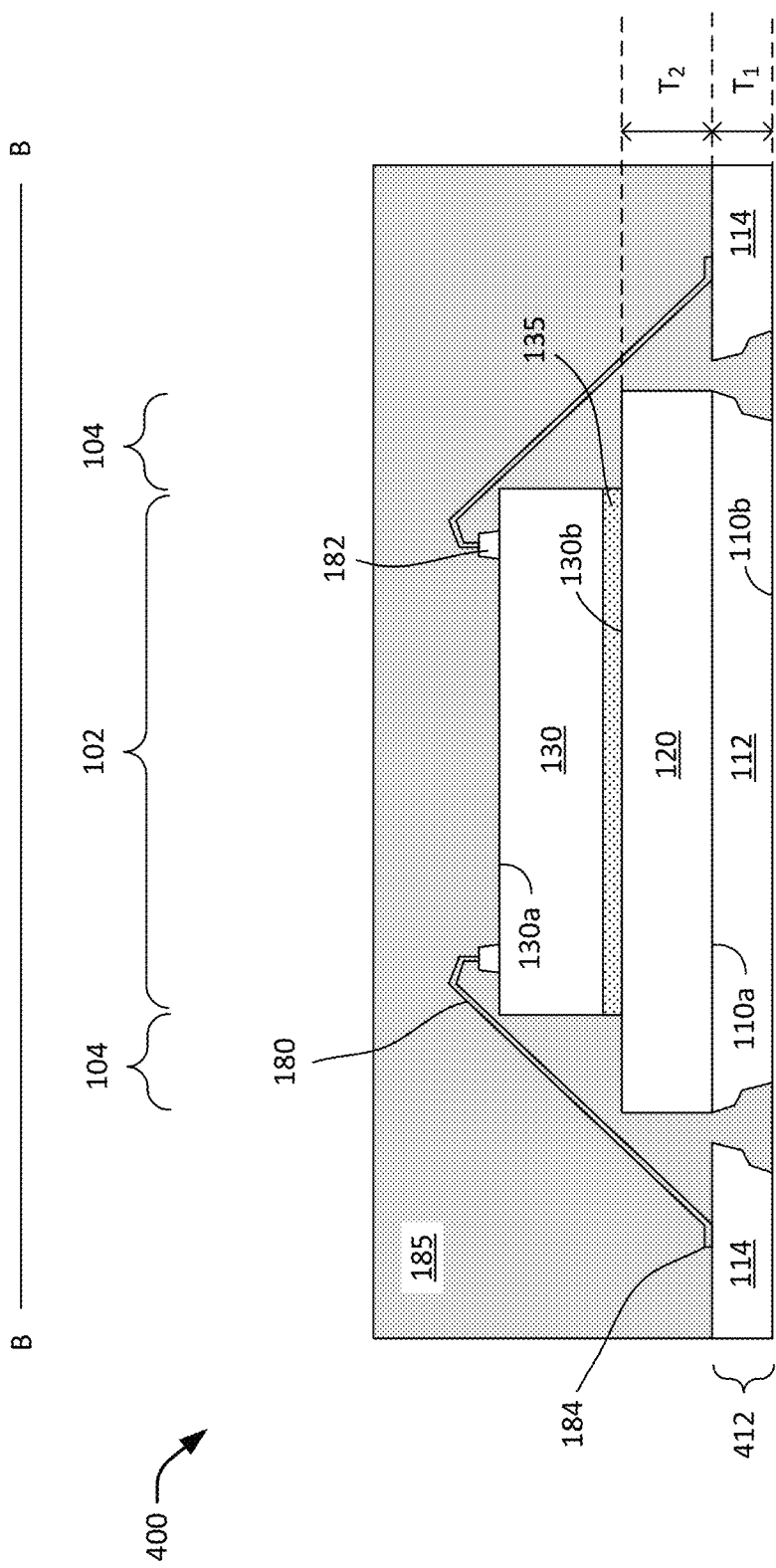

Referring to FIG. 4g, an encapsulant structure 185 is formed. The top planar surface of the encapsulant structure 185 extends above the wire bonds 180 and semiconductor die 130. For example, the encapsulant structure 185 surrounds the semiconductor die 130, the heat spreader 120, and the wire bonds 180. In one embodiment, the encapsulant structure 185 is configured to extend into the gap between the lead fingers 114 and the die-attach paddle 112, and expose the bottom planar surface of the lead frame 412. For example, the bottom planar surface of the encapsulant structure 185 is substantially coplanar with the bottom substrate surface 110b, including the bottom planar surface of the die-attach paddle 112 and lead fingers 114.

The encapsulant structure 185 may be formed from any suitable molding compound such as ceramic, plastic, epoxy, or a combination thereof, to provide a rigid and mechanically strong structure to protect the semiconductor die 130 from the environment. For example, the encapsulant structure 185 protects the semiconductor die 130 from moisture.

In one embodiment, the process continues by performing a package singulation process. The encapsulant structure 185 may provide mechanical support for the singulation process. The array of lead frame units 410 are, for example, singulated by sawing through the package substrate 412 and encapsulant structure 185 (e.g., from the bottom substrate surface 110b to the top planar surface of the encapsulant structure) such that the sidewalls of the encapsulant structure 185 substantially aligns to the exposed outer sidewalls of the lead fingers 114. The singulation process physically separates an encapsulated lead frame unit 410 from other encapsulated lead frame units 410 to form individual semiconductor packages 100, such as that described in FIG. 1a.

In an alternative embodiment, the encapsulated lead frame units 410 may be singulated by a punch singulation process. The punch singulation process, for example, forms an encapsulation structure having sloped sidewalls, such as that described in FIG. 1b. Other singulation techniques may also be employed to form the individual semiconductor packages 100.

It is appreciated that a plating process may optionally be performed after forming the encapsulation structure 185 and prior to package singulation. For example, the exposed bottom substrate surface 110b of the lead frame 412 may be plated with a lead finished material, such as matte tin (Sn), using electroplating process prior to performing any singulation process. In the case of a copper lead frame, or a silver-plated copper lead frame, plating the bottom substrate surface 110b with a lead finished material advantageously prevents oxidation on the exposed metal surface of the die-attach paddle 112 and lead fingers 114.

FIGS. 5a-5d show cross-sectional views of another embodiment of a process 500 for forming a semiconductor package. The process 500 may be employed to form, for example, a semiconductor package same or similar as that described in FIG. 3. The process 500 includes similar process steps as that described in FIGS. 4a-4g. In the interest of brevity, common elements, common process steps and features having the same reference numerals may not be described or described in detail.

Figure 5A:
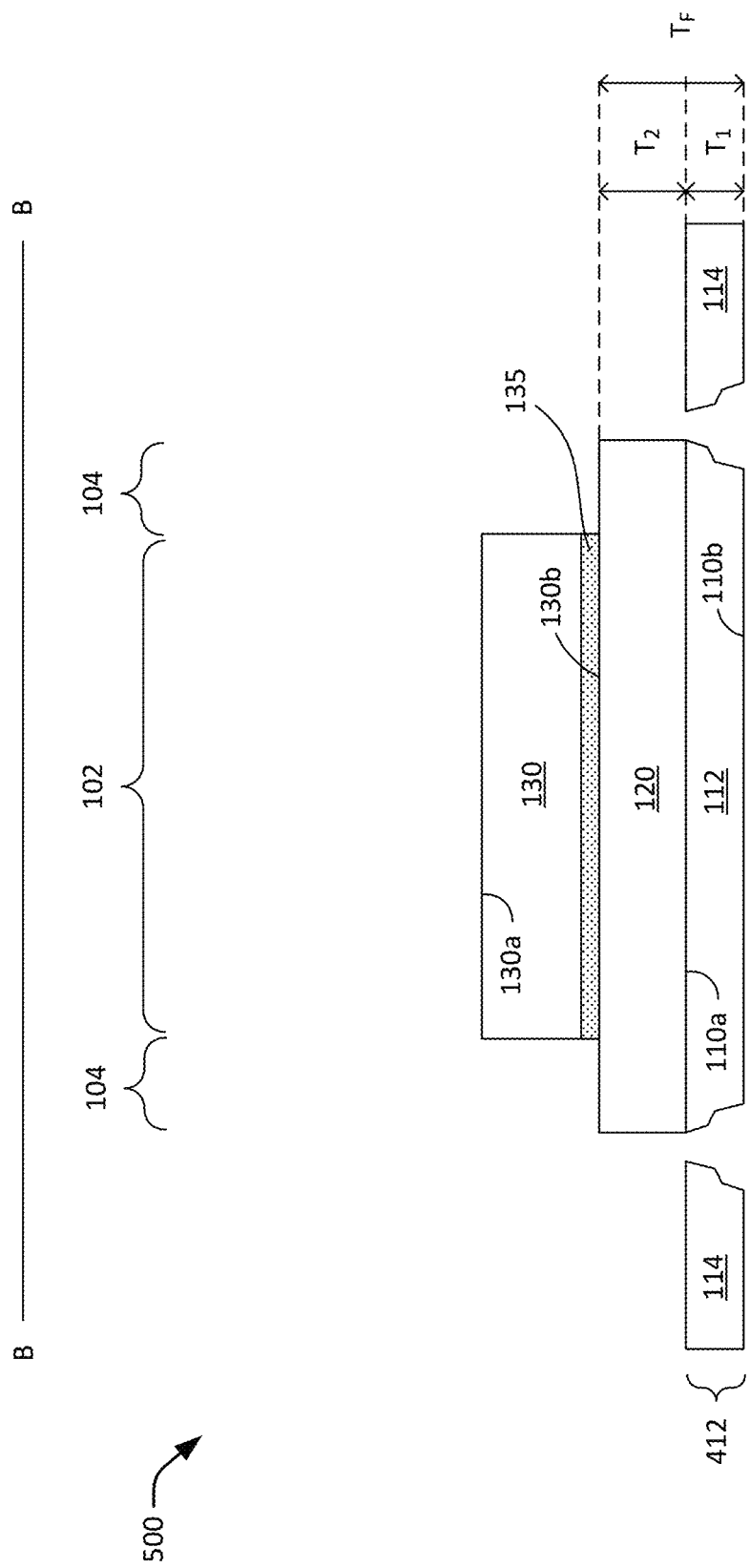
FIGS. 5a-5d show cross-sectional views of another embodiment of a process for forming a semiconductor package.

Referring to FIG. 5a, a partially processed package substrate 412 is provided. The partially processed semiconductor package is at the same stage as that described in FIG. 4e. For example, the features of the partially processed package substrate 412 are formed by processes same or similar to that described in FIGS. 4a-4e.

Figure 5B:
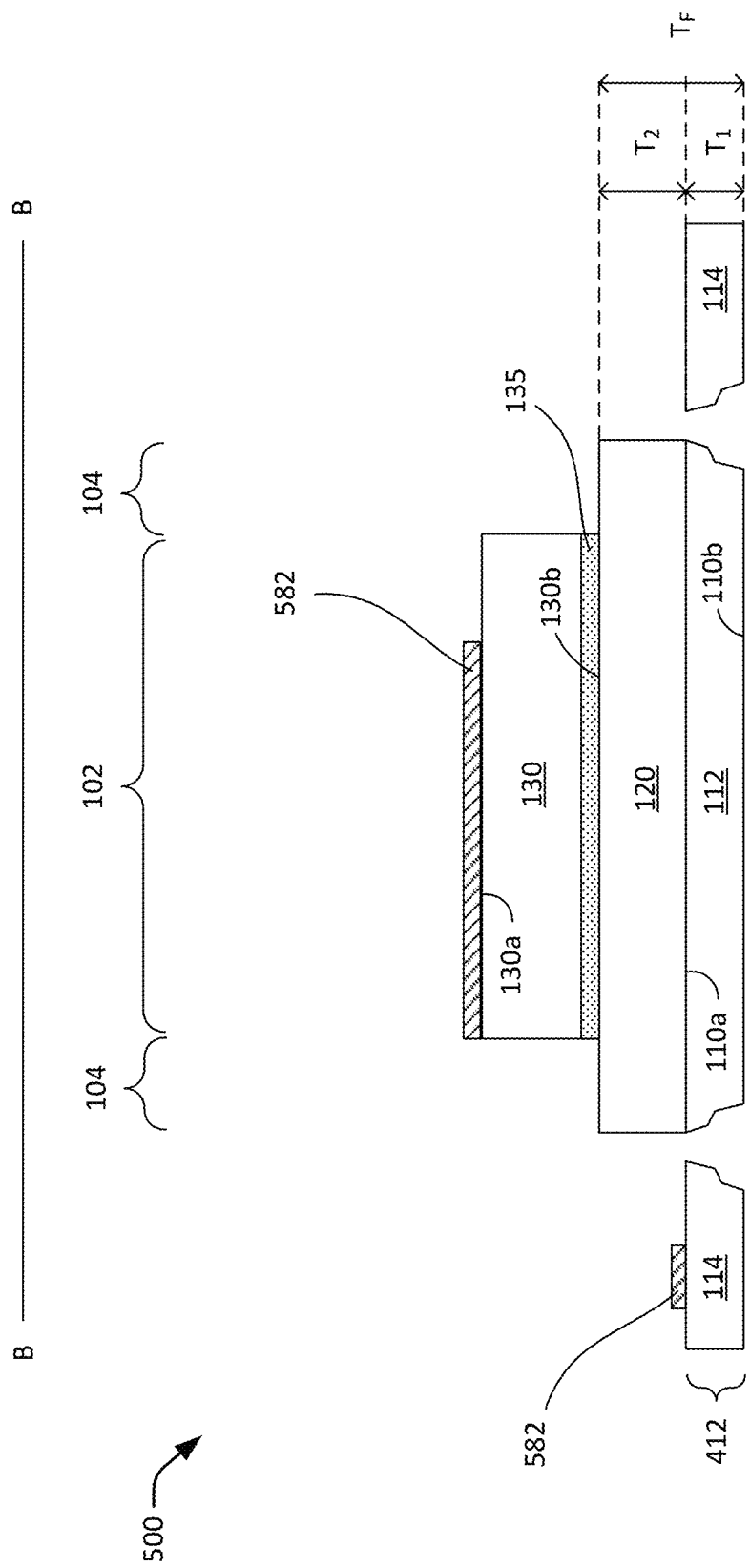

Referring to FIG. 5b, the process 500 continues by forming a thermally and electrically conductive adhesive layer 582 over the partially processed package substrate 412. The adhesive layer 582 includes, for example, a solder material. Other types of adhesive material having good electrical and thermal properties may also be employed. The adhesive layer 582 may be formed using any suitable deposition processes, including printing and dispensing processes. In one embodiment, the adhesive layer 582 is formed by employing a screen-print process to deposit solder paste on the top surface 130a of the semiconductor die 130a and on the top surface of a plurality of preselected lead fingers 114. The adhesive layer 582, for example, contacts and covers a plurality of preselected die pads (not shown) on the top surface 130a of the semiconductor die 130.

Figure 5C:
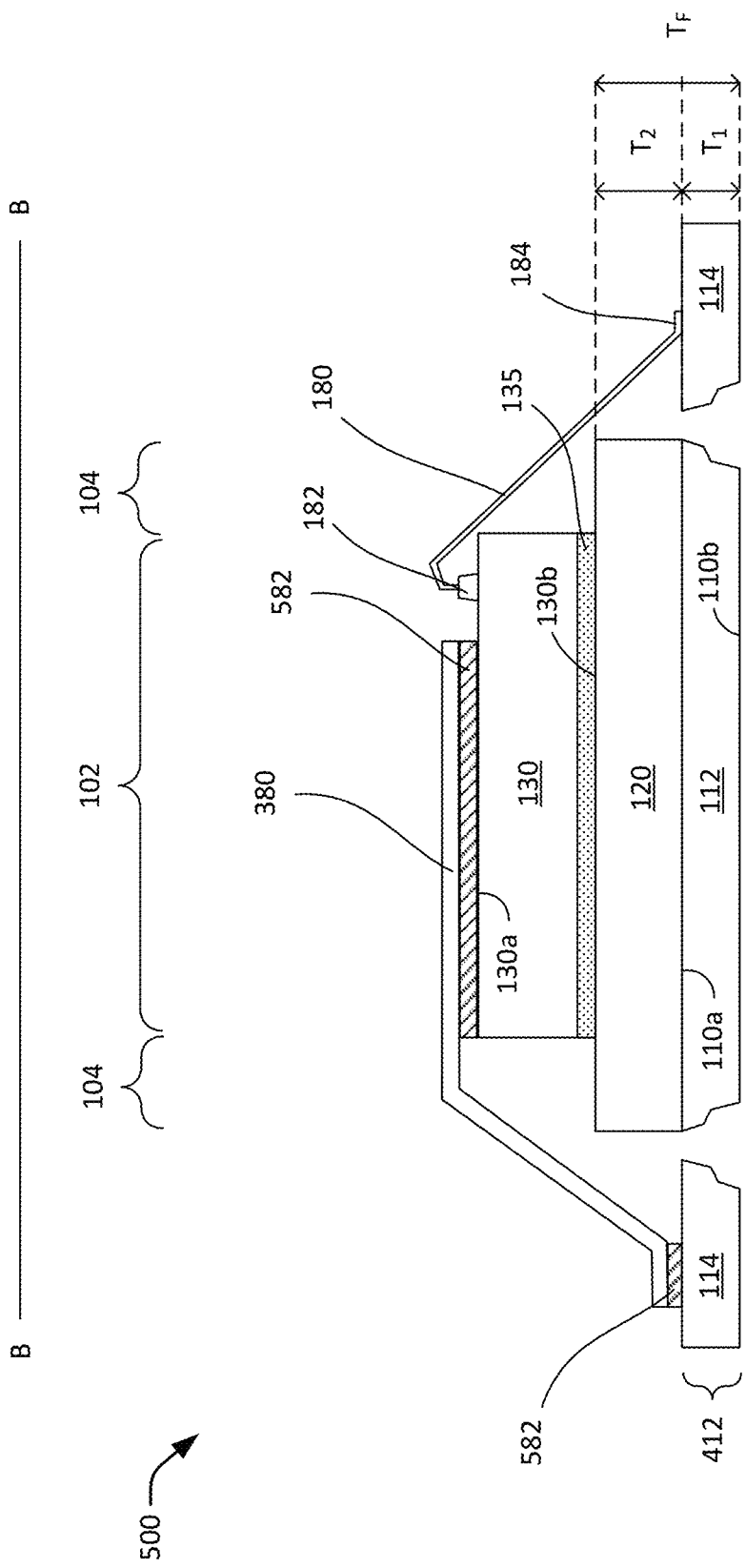

Referring to FIG. 5c, a thermally and electrically conductive clip structure 380 is disposed on the adhesive layer 582. The clip structure 380 is, for example, a copper clip structure. Other metal materials may also be used to form the clip structure. The adhesive layer 582 electrically and mechanically attaches the top planar portion of the clip structure 380 to the top surface 130a of the semiconductor die 130. Similarly, the adhesive layer 582 electrically and mechanically bonds the bottom planar portion of the clip structure 380 to the top surface 130a of associated lead fingers 114. For example, a solder reflow process is performed to complete the process of bonding the clip structure 380 to the semiconductor die 130 and the preselected lead fingers 114 using solder paste 582.

In one embodiment, the process 500 continues to form wire bonds 180 by processes described in FIG. 4f. Wire bonds are, for example, formed to electrically connect a portion or all of the remaining die pads (not connected to the clip structure) to associated lead fingers. For example, the clip structure may electrically connect the semiconductor die 130 to source leads and the wire bonds 180 may electrically connect the semiconductor die 130 to gate leads. Other configurations of clip structure and wire bonds may also be useful.

Figure 5D:
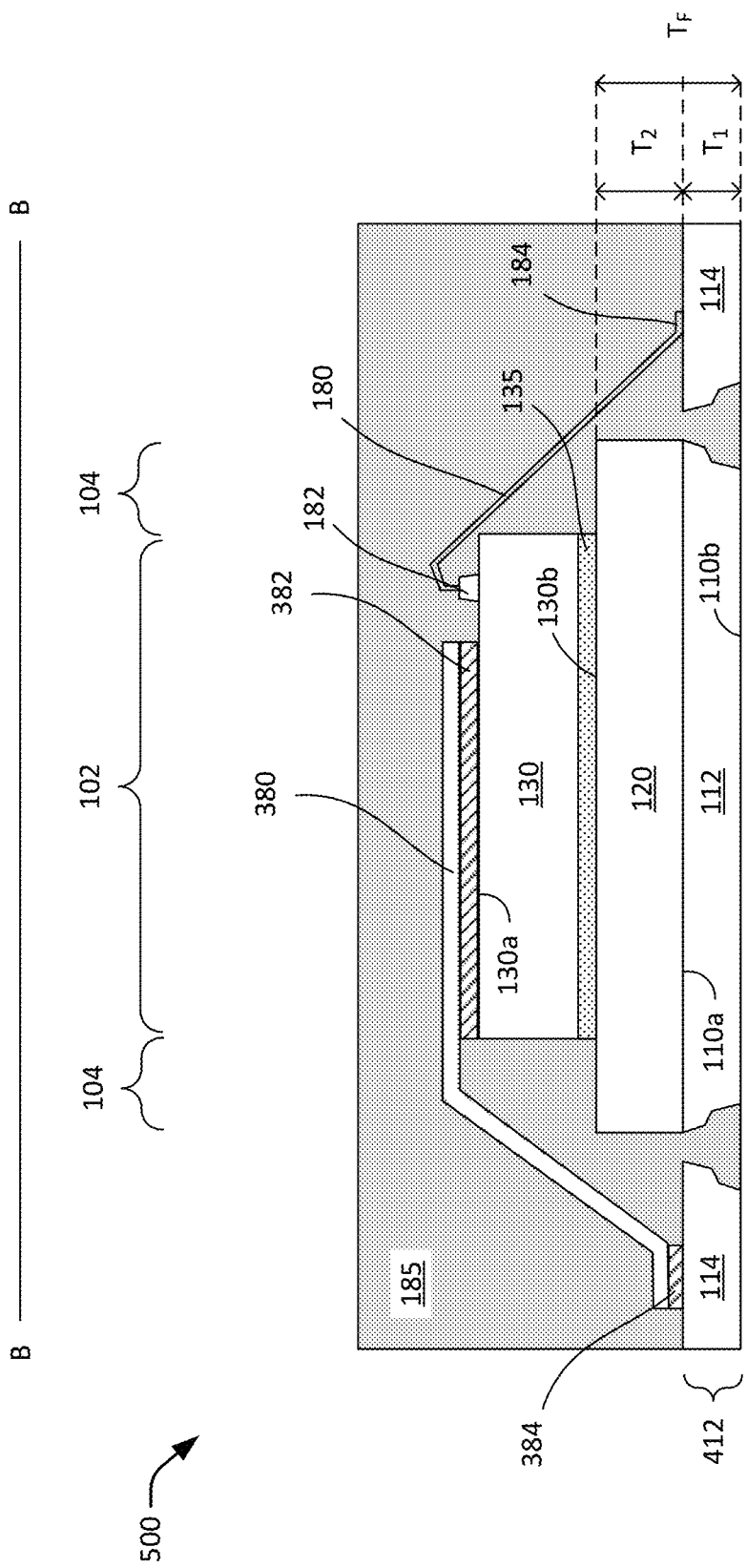

Referring to FIG. 5d, an encapsulant structure 185 is formed. The encapsulant structure, for example, encapsulates the clip structure 380, the wire bonds 180, the semiconductor die 130 and the heat spreader 120. In one embodiment, the encapsulant structure 185 is configured to extend into the gap between the lead fingers 114 and the die-attach paddle 112, and expose the bottom planar surface of the lead frame 412. For example, the bottom planar surface of the encapsulant structure 185 is substantially coplanar with the bottom substrate surface 110b, including the bottom planar surface of the die-attach paddle 112 and lead fingers 114. The encapsulant structure 185 may be formed by processes same or similar to that described in FIG. 4g.

In one embodiment, the process 500 continues by performing a package singulation process. The encapsulant structure 185 may provide mechanical support for the singulation process. The array of lead frame units 410 are, for example, singulated by sawing through the package substrate 412 and encapsulant structure 185 (e.g., from the bottom substrate surface 110b to the top planar surface of the encapsulant structure) such that the sidewalls of the encapsulant structure 185 substantially aligns to the exposed outer sidewalls of the lead fingers 114. The singulation process physically separates an encapsulated lead frame unit 410 from other encapsulated lead frame units 410 to form individual semiconductor packages 300, such as that described in FIG. 3.

Although, a saw singulation process is described, it is understood that the process 500 may also employ a punch singulation process. For example, a punch singulation process may be performed to configure the semiconductor package 300 described in FIG. 3 with an encapsulant structure 185 having sloped sidewalls.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor package comprising:
   a package substrate comprising a top substrate surface and a bottom substrate surface, wherein the package substrate comprises a thickness extending from the top substrate surface to the bottom substrate surface;
   a heat spreader disposed on the top substrate surface, the heat spreader comprises a top planar surface and a bottom planar surface, wherein the top planar surface of the heat spreader is defined with a die region and a non-die region surrounding the die region, wherein the heat spreader comprises a thickness extending from the top planar surface the bottom planar surface;
   a semiconductor die, wherein the semiconductor die is directly disposed on the top planar surface of the heat spreader in the die region;
   wherein the package substrate is a lead frame comprising a die-attach paddle and a plurality of lead fingers peripherally located relative to the die-attach paddle, wherein the heat spreader is directly disposed on a top surface of the die-attach paddle; and
   wherein the thickness of the heat spreader is greater relative to the thickness of the package substrate.

2. The semiconductor package of claim 1 wherein the heat spreader covers the entire top surface of the die-attach paddle without extending beyond the die-attach paddle.

3. The semiconductor package of claim 1 wherein the heat spreader and the lead frame comprises copper material.

4. The semiconductor package of claim 1 comprising wire bonds, wherein the wire bonds electrically connect the semiconductor die to the plurality of lead fingers.

5. The semiconductor package of claim 1 comprising a metal clip structure, wherein the metal clip structure electrically connect the semiconductor die to the plurality of lead fingers.

6. The semiconductor package of claim 1 wherein the heat spreader and the die-attach paddle collectively corresponds to a heat sink element having a thickness substantially equal to 20 mils.

7. The semiconductor package of claim 1 comprising an encapsulant structure, wherein the encapsulant structure encapsulates at least the semiconductor die and the heat spreader, wherein the encapsulant structure covers and contacts the non-die region and sidewalls of the heat spreader.

8. A semiconductor package comprising:
   a lead frame, the lead frame comprises a die-attach paddle and a plurality of lead fingers peripherally located relative to the die-attach paddle, wherein the die-attach paddle comprises a thickness extending from a top planar surface to a bottom planar surface of the die-attach paddle;
   a heat spreader disposed on the top planar surface of the die-attach paddle, the heat spreader comprises a top planar surface and a bottom planar surface, wherein the top planar surface of the heat spreader is defined with a die region and a non-die region surrounding the die region, wherein the heat spreader comprises a thickness extending from the top planar surface to the bottom planar surface of the heat spreader;
   a semiconductor die, wherein the semiconductor die is directly disposed on the top planar surface of the heat spreader in the die region; and
   wherein the thickness of the heat spreader is greater relative to the thickness of the die-attach paddle.

9. The semiconductor package of claim 8 comprising an encapsulant structure, wherein the encapsulant structure encapsulates at least the semiconductor die and the heat spreader, wherein the encapsulant structure covers and contacts the non-die region and sidewalls of the heat spreader.

10. The semiconductor package of claim 9 wherein the heat spreader covers the entire top surface of the die-attach paddle without extending beyond the die-attach paddle.

11. The semiconductor package of claim 9 wherein the heat spreader and the lead frame comprises copper material.

12. The semiconductor package of claim 9 comprising wire bonds, wherein the wire bonds electrically connect the semiconductor die to the plurality of lead fingers.

13. The semiconductor package of claim 9 comprising a metal clip structure, wherein the metal clip structure electrically connect the semiconductor die to the plurality of lead fingers.

14. The semiconductor package of claim 8 comprising an electrically and thermally conductive adhesive layer disposed directly between the semiconductor die and the heat spreader.

15. A semiconductor package comprising:
  a lead frame, wherein the lead frame comprises a die-attach paddle and a plurality of lead fingers peripherally located relative to the die-attach paddle, wherein the die-attach paddle comprises a thickness extending from a top planar surface to a bottom planar surface of the die-attach paddle;
  a heat spreader, wherein the heat spreader is coupled to the top planar surface of the die-attach paddle, the heat spreader comprises a top planar surface and a bottom planar surface, wherein the top planar surface of the heat spreader is defined with a die region and a non-die region surrounding the die region, wherein the heat spreader comprises a thickness extending from the top planar surface to the bottom planar surface of the heat spreader;
  a semiconductor die, wherein the semiconductor die is mounted to the top planar surface of the heat spreader in the die region, wherein the heat spreader is sandwiched between the semiconductor die and the die-attach paddle; and
  wherein the thickness of the heat spreader is greater relative to the thickness of the die-attach paddle.

16. The semiconductor package of claim 15 wherein the heat spreader and the die-attach paddle comprise a same metal material.

17. The semiconductor package of claim 15 comprises an encapsulant structure, wherein the encapsulant structure encapsulates at least the semiconductor die and the heat spreader, wherein the encapsulant structure covers and contacts the non-die region and sidewalls of the heat spreader.

18. The semiconductor package of claim 15 wherein the heat spreader covers entirely the top planar surface of the die-attach paddle without extending beyond the die-attach paddle.

19. The semiconductor package of claim 15 comprising wire bonds, wherein the wire bonds electrically connect the semiconductor die to the plurality of lead fingers.

* * * * *